(12) United States Patent
Kalnitsky et al.

(10) Patent No.: US 8,497,551 B2
(45) Date of Patent: Jul. 30, 2013

(54) SELF-ALIGNED CONTACT FOR TRENCH MOSFET

(75) Inventors: Alex Kalnitsky, San Francisco, CA (US); Hsiao-Chin Tuan, Judong County (TW); Kuo-Ming Wu, Hsinchu (TW); Wei Tsung Huang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 116 days.

(21) Appl. No.: 12/792,025

(22) Filed: Jun. 2, 2010

(65) Prior Publication Data

US 2011/0298045 A1 Dec. 8, 2011

(51) Int. Cl.
*H01L 29/66* (2006.01)

(52) U.S. Cl.
USPC ............ 257/331; 257/E21.655; 257/332; 438/270

(58) Field of Classification Search
USPC ............ 257/331, 334, 302, 330, 332, 341, 257/336, E29.2, E29.201, E21.549, E21.655; 438/270, 272, 424, 427
See application file for complete search history.

(56) References Cited

U.S. PATENT DOCUMENTS

| | | | | |
|---|---|---|---|---|
| 5,262,336 A | * | 11/1993 | Pike et al. | 438/138 |
| 6,888,196 B2 | | 5/2005 | Kobayashi | |
| 6,916,745 B2 | | 7/2005 | Herrick et al. | |
| 7,816,720 B1 | * | 10/2010 | Hsieh | 257/302 |
| 2001/0052617 A1 | * | 12/2001 | Kitada et al. | 257/330 |
| 2005/0167742 A1 | | 8/2005 | Challa et al. | |
| 2007/0194374 A1 | * | 8/2007 | Bhalla et al. | 257/330 |
| 2010/0127324 A1 | | 5/2010 | Hsieh | |
| 2011/0291186 A1 | * | 12/2011 | Yilmaz et al. | 257/334 |

FOREIGN PATENT DOCUMENTS

CN   101677103   3/2010

OTHER PUBLICATIONS

OA dated Jul. 27, 2012 from corresponding application No. CN201010552507.X.

* cited by examiner

*Primary Examiner* — Thanh Y Tran
(74) *Attorney, Agent, or Firm* — Lowe Hauptman Ham & Berner, LLP

(57) ABSTRACT

The process methods and structures mentioned above for creating a trench MOSFET enables self-aligned contacts to be formed to allow decreasing pitch size for trench MOSFET. The self-aligned contacts are formed by etching exposed silicon areas without using lithographical mask and alignment. As a result, the allowance for alignment can be saved and the pitch size can be decreased.

20 Claims, 12 Drawing Sheets

1

SELF-ALIGNED CONTACT FOR TRENCH MOSFET

FIELD

This application relates to trench MOSFET technology and, more particularly, to trench MOSFET having self-aligned contacts.

BACKGROUND

The semiconductor integrated circuit (IC) industry has experienced rapid growth. Technological advances in IC materials and design have produced generations of ICs where each generation has smaller and more complex circuits than the previous generation. Such advances have increased the complexity and challenges of processing and manufacturing of ICs.

Vertically-conducting trench MOSFETs (metal oxide semiconductor field effect transistors) can be used as power electronics. When a trench MOSFET is biased in the on state, current flows vertically between source regions and substrate. Reducing cell pitch of MOSFETs is crucial in reducing the device sizes and in increasing the number of active devices on a semiconductor chip. In addition, cell pitch also affect device performance, such as the resistivity between source and drain when the device is on (Rdson). Reducing cell pitch is limited by the manufacturing process technology, such the capability of lithographical tool in resolving minimum critical dimension and in aligning different patterning layers. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1:
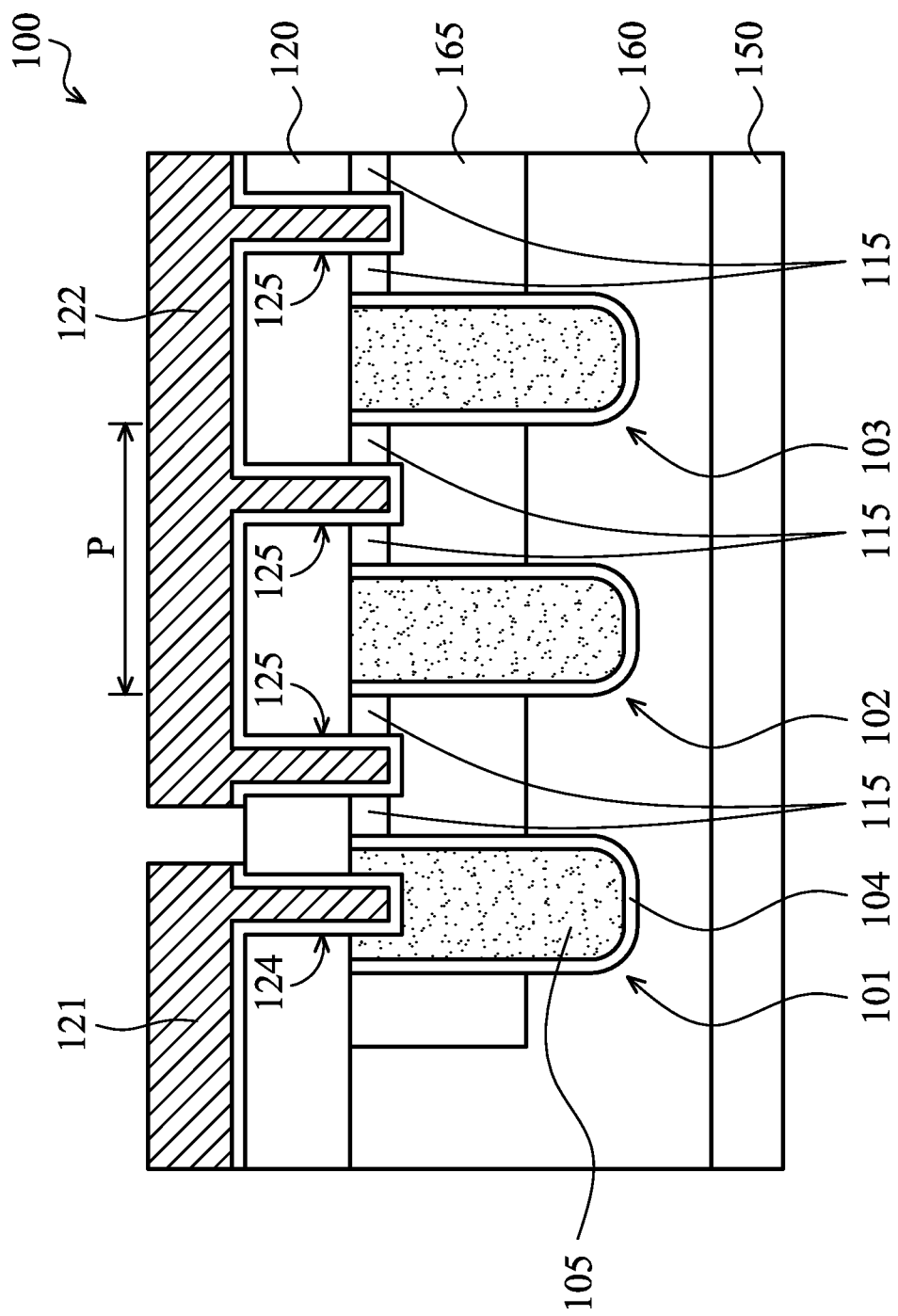
FIG. 1 shows a cross-sectional view of a trench metal oxide semiconductor field effect transistor (MOSFET), in accordance with some embodiments.

FIG. 1 shows a cross-sectional view of a trench metal oxide semiconductor field effect transistor (MOSFET) 100, in accordance with some embodiments. In some embodiments, trench MOSFET 100 is part of a power device, which operates at a voltage between about 1.8V to about 600 V. Trench MOSFET 100 has trenches 101, 102, and 103, with gate oxide 104 grown on the sidewalls of the trenches and the trenches being filled with gate polysilicon 105. Trench MOSFET can be a N-MOSFET or a P-MOSFET. For simplicity, the embodiments of trench MOSFETs described below are for N-MOSFETs. However, similar structures and methods of making said similar structures are applied to P-type trench MOSFETs. In addition, the substrate, where the trench MOSFET 100 is build, can have other device structures.

Trench MOSFET 100 is formed above a substrate region 150, which is doped with N type dopants (or an N+ substrate). The N+ (or highly doped with N dopant) doped substrate region 150 also acts as the drain for trench MOSFET 100. Above substrate region 150, there is an N-type epitaxial layer 160. Portions of trenches 101, 102, and 103 are surrounded by a P-type doped region 165. The polysilicon gate 105 in trench 101 is connected to gate metal 121 via contact 124 (gate contact). The source regions 115 connect to source metal 122 through contacts 125 (source contacts). The contacts 124, 125, gate metal 121, and source metal 122 are lined with an adhesion/barrier layer 124. Trench MOSFET 100 may include more trenches fill with polysilicon gates 105 that are similar to trenches 102 and 103. In the embodiment shown in FIG. 1, only two such trenches 102 and 103 are shown. In some embodiments, there are more than two trenches under the source metal 122. In some other embodiments, only one single trench 102 under source metal 122 exists (trench 103 does not exist). Trench MOSFET 100 includes source regions 115 between trenches 101, 102, and 103. When trench MOSFET 100 is biased to the on state, current flows vertically between source regions 115 and drain region 150.

The cell pitch of trench MOSFET 100 is "P", which is the distance between two neighboring trenches 102 and 103, as shown in FIG. 1. To reduce cell pitch "P" to increase device density, the width of trenches, such as trenches 102 and 103, and width of contacts 125, and alignment control of contacts 125 to trenches 102 and 103 can be reduced. There are processing and integration concerns when the widths of trenches and contacts are reduced. However, if the contacts 125 are self-aligned, the alignment control allowance of contacts 125 to trenches 102 and 103 can be completely removed. As a result, forming self-aligned contacts allows cell pitch of MOSFET 100 to be reduced.

Figure 2A:
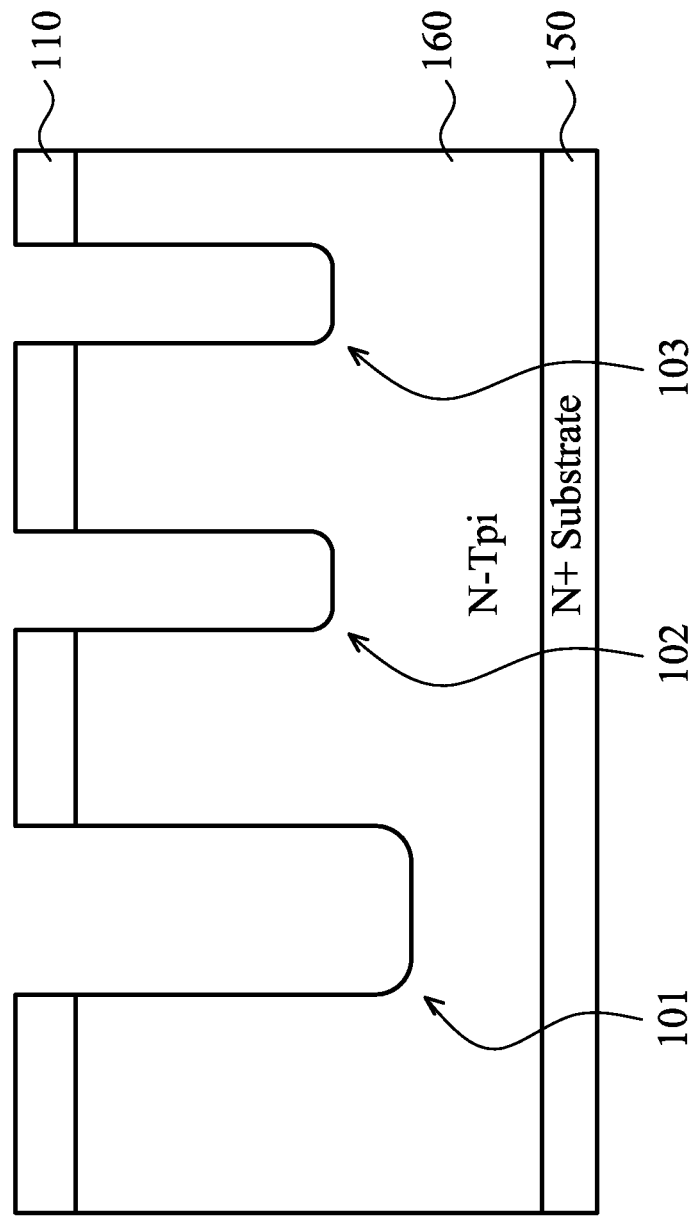
FIGS. 2A-2J shows structures and intermediate stages in a process flow for creating a trench MOSFET with self-aligned contacts, in accordance with some embodiments.

FIGS. 2A-2J shows structures and intermediate stages in a process flow for creating a trench MOSFET with self-aligned contacts, in accordance with some embodiments. FIG. 2A shows a N+ substrate (substrate doped with N-type dopant) 150 with a N-epitaxial layer (epitaxial layer doped with N-type dopant) 160 and a dielectric hard mask layer 110. The dielectric hard mask layer 110 forms the pattern to create trenches 101, 102, and 103. The dielectric hard mask layer 110 can be made of oxide, nitride, oxynitride, or a combination of above-mentioned films. In some embodiments, the dielectric hard mask layer 110 is made of PECVD (plasma-enhanced chemical vapor deposition) oxide with a thickness between about 200 Å (angstroms) to about 20,000 Å. After the deposition of the dielectric hard mask layer 110, deep trench etching (a silicon etch) is performed on the substrate to create trenches 101, 102, and 103. In some embodiments, the trench opening for trench 101 is larger than trenches 102 and 103 and trench 101 is deeper than trenches 102 and 103.

In some embodiments, the widths of trenches 101, 102, and 103 are between about 0.1 µm to about 10 µm. In some embodiments, the depths of trenches 101, 102, and 103 are between about 0.2 µm to about 40 µm. The aspect ratio (AR) of a trench is defined by the depth of the trench by the width of the trench. In some embodiment, the ARs of trenches 101, 102, and 103 are between about 1 to about 30. In some other embodiments, the ARs of trenches 101, 102, and 103 are between about 5 to about 15.

Figure 2B:
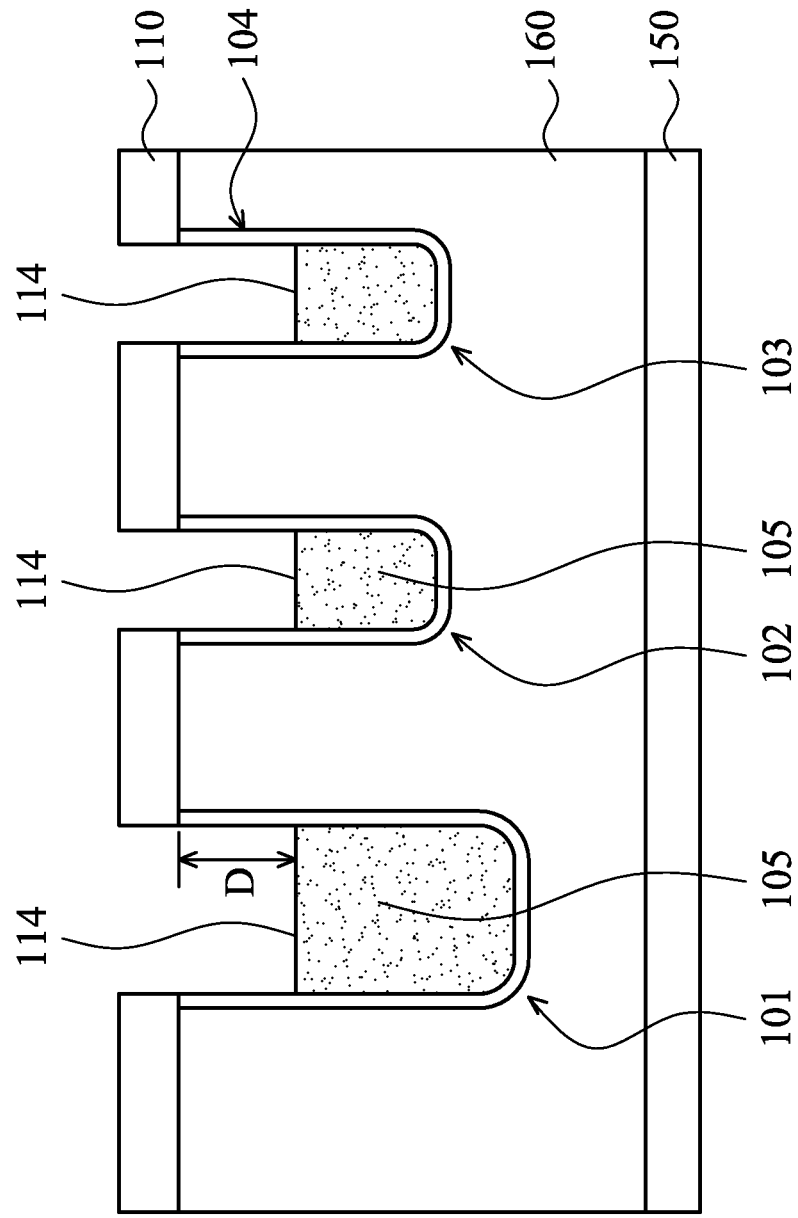

After deep trench etch, the gate oxide layer 104 is grown as shown in FIG. 2B, in accordance with some embodiments. In some embodiments, the thickness of the gate oxide layer 104 is between about 40 Å to about 2000 Å. In some embodiments, the growth of the gate oxide layer 104 is performed at a temperature greater than about 900° C. in an environment with oxygen, steam, or a combination of both. A sacrificial oxide layer (not shown) may be grown to line the trench and removed afterwards before the growth of gate oxide layer 104, in accordance with some embodiments. The growth and removal of the sacrificial oxide layer are used to condition silicon surface of trenches.

After the gate oxide layer 104 is grown, a gate polysilicon layer 105 is deposited to fill the trenches 101, 102, and 103. In some embodiments, the gate polysilicon is doped to increase its conductivity. The dopant may be phosphorous, in accordance with some embodiments. Other types of dopants may also be used. In some embodiments, a thick insulating layer, such as between about a few thousand angstroms to about several microns of oxide, is deposited on the bottom of trenches, prior to gate polysilicon deposition. The thick insulating layer can reduce gate capacitance.

After the gate polysilicon layer 105 is deposited, the excess polysilicon outside the trenches (including polysilicon deposited on top of dielectric layer 110) is removed by methods, such as etching (etchback). After etching, the gate polysilicon layer 105 in the trenches is below the surface of epitaxial layer 160 with a distance "D". In some embodiments, the distance "D" is between about 0.1 μm to about 2.0 μm. In some embodiments, the gate polysilicon layer 105 above dielectric layer 110 (after gate polysilicon deposition) is first removed by chemical-mechanical polishing (CMP) before an etching (or etchback) process is applied to reduce the gate polysilicon layer 105 to a distance "D" below the surface of dielectric layer 110. The CMP processing before etchback allows the surfaces 114 of gate polysilicon layer 105 in the trenches 101, 102, and 103 be smooth, as shown in FIG. 2B.

Figure 2C:
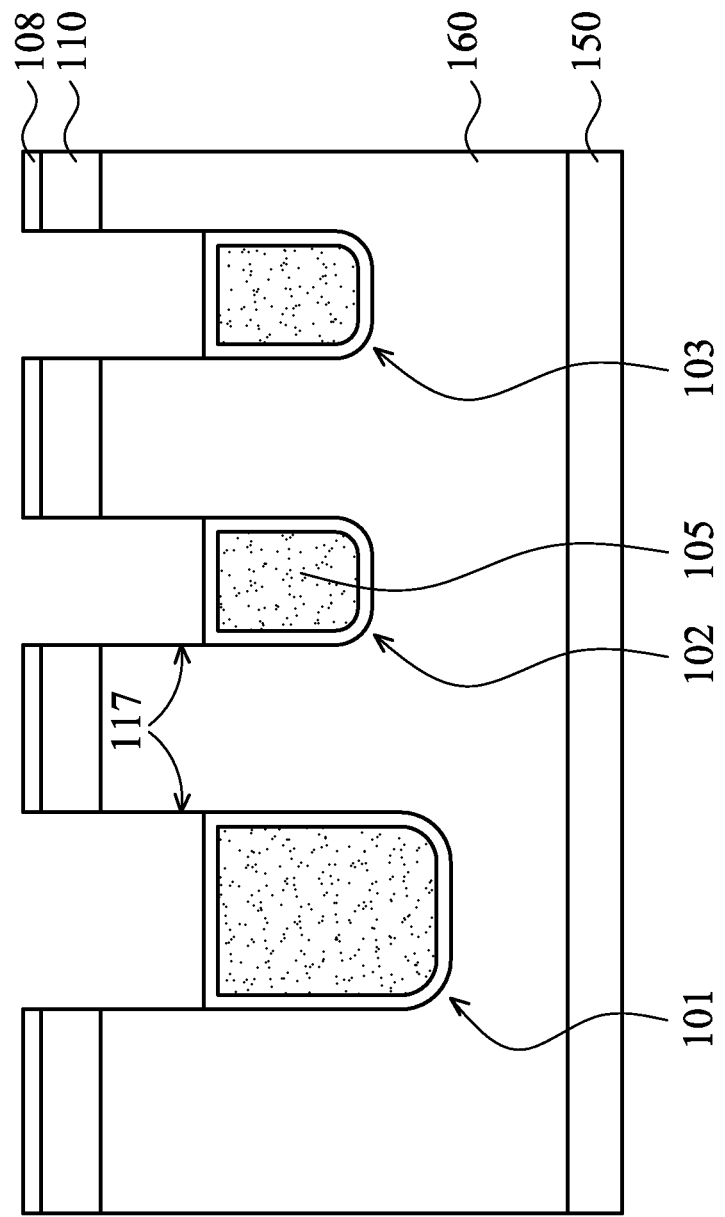

FIG. 2C shows a thin oxide layer 108 covering the surface 114 of gate polysilicon layer 105 and the dielectric layer 110, but not the sidewall 117, in accordance with some embodiments. The thin oxide layer 108 is formed by first depositing a thicker oxide layer 108' (not shown) on the substrate of FIG. 2B to cover the substrate surface. The intent of the thicker oxide layer 108' is to cover the silicon surface 114 of gate polisilicon 105 with minimal deposition on the sidewalls of trenches. In some embodiments, the thickness of the thicker oxide layer 108' is between about 200 Å to about 10,000 Å. The In some embodiment, HDP CVD process is used to allow minimal oxide deposition on the sidewalls. After the thicker oxide layer 108' is deposited, an oxide etch, such as wet oxide etch using buffered oxide etch (BOE), is performed to remove oxide on the sidewalls of trenches 101, 102, and 103. During the etching process, the oxide layer above the gate polylicon 105 is also thinned (or etched). After oxide etch, the silicon sidewalls 117 are exposed and a thin oxide layer 108 covers the gate polysilicon layer 105. In some embodiments, the thickness of the thin (or protective) oxide layer 108 covering the gate polysilicon 105 after etch is greater than 100 Å to protect polysilicon gate 105 from damage during subsequent substrate processing.

Figure 2D:
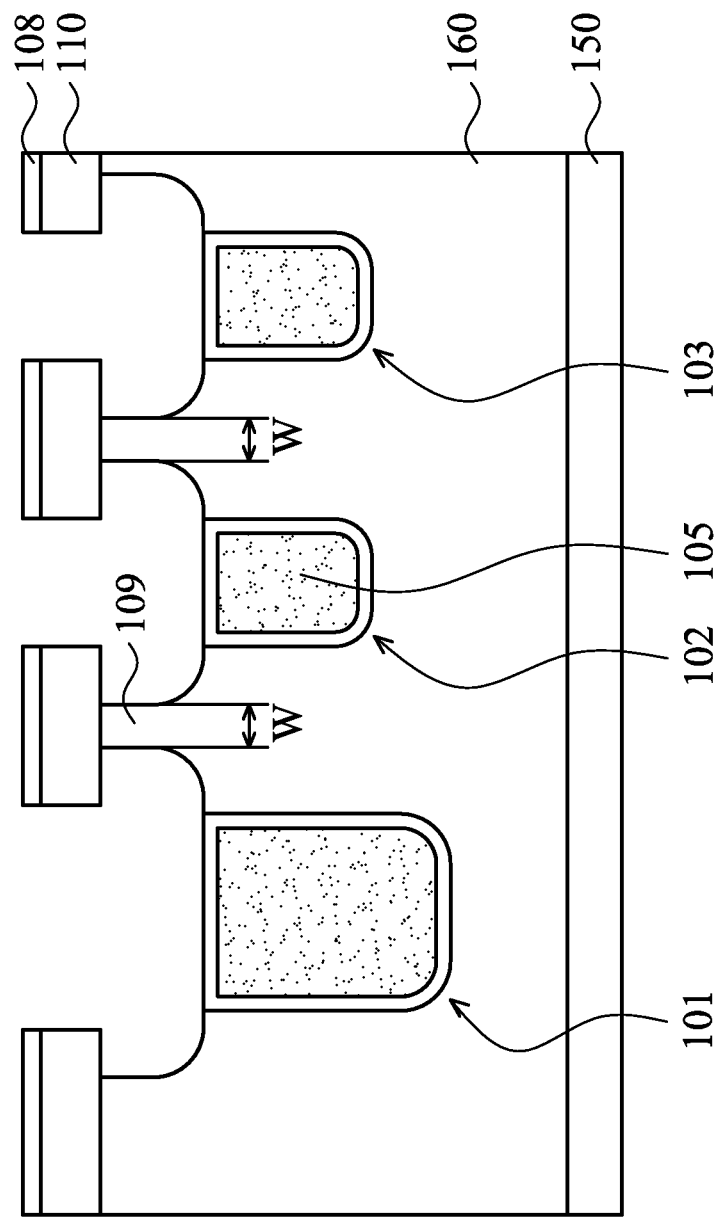

Following sidewall oxide removal mentioned above, an isotropic silicon etching is performed to create silicon undercut below hard mask layer 110. The isotropic silicon etching is timed to create a desired silicon width "W" between trenches 101 and 102, and between trenches 102 and 103, as shown in FIG. 2D in accordance with some embodiments. The silicon regions 109 with width "W" define self-aligned contacts at later operations.

Figure 2E:
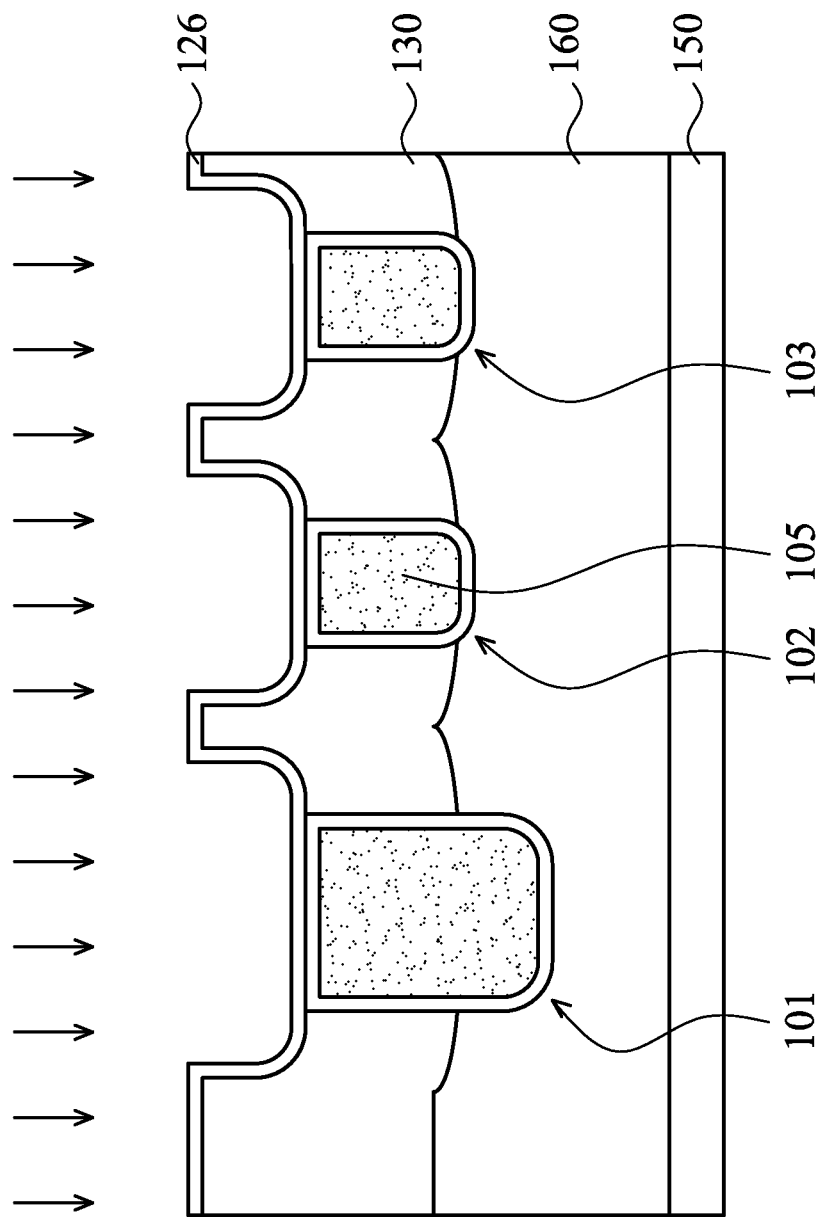

Afterwards, the hard mask layer 110 and the protective oxide layer 108 are removed and a sacrificial oxide layer 126 is deposited, as shown in FIG. 2E in accordance with some embodiments. The oxide layers 110 and 108 can be removed by various processes, such as BOE wet etching. After oxide removal, a sacrificial oxide layer 126 is grown on the substrate surface with silicon or polysilicon. In some embodiments, the thickness of the sacrificial oxide layer 126 is between about 100 Å to about 1000 Å. In some embodiments, the growth of the sacrificial oxide layer 126 is performed at a temperature greater than about 900° C. in an environment with oxygen, steam, or a combination of both. After the growth of sacrificial oxide layer 126, a blanket substrate body implant with P-type dopant is performed. In some embodiments, the dopant is Boron and the dopant energy is between about 5 KeV to about 2000 KeV. In some embodments, the dosage is between about 1E11 ions/cm$^2$ to bout 5E14 ions/cm$^2$. The implanted dopant is then driven deeper into the substrate by a thermal anneal (or a thermal drive-in process). In some embodiment, the temperature of the thermal anneal is greater than about 900° C. The thermal anneal can be a furnace anneal or a rapid thermal anneal. FIG. 2E shows the profile of P-type dopant region 130 after the implant and anneal are performed, in accordance with some embodiments.

Figure 2F:
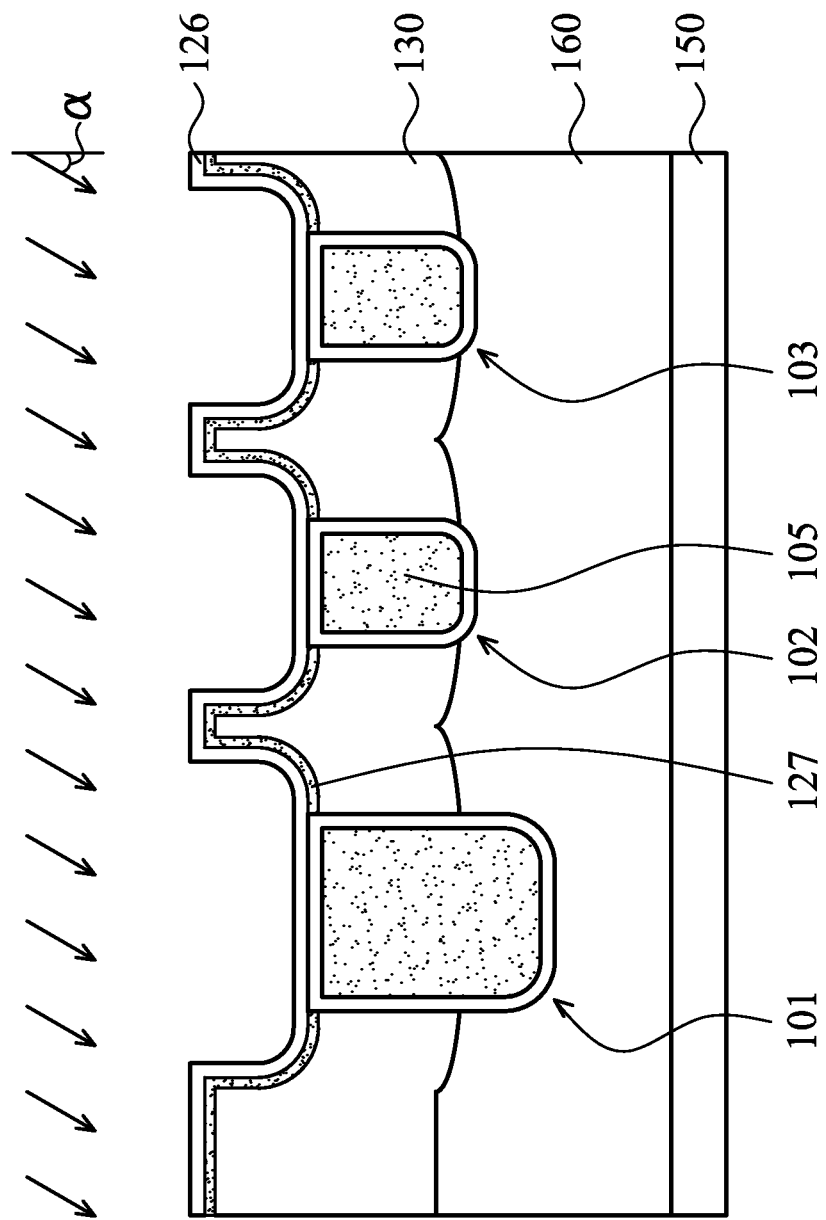

Following the P-type implant, an N+ source implant is performed on the substrate, as shown in FIG. 2F in accordance with some embodiments. In some embodiments, the implant dopant is arsenic or phosphorus and the implant energy is between 5 KeV to about 200 KeV. In some embodiments, the dosage is between about 5E14 ions/cm$^2$ to bout 1E17 ions/cm$^2$. The N+dopant implant is performed at an angle to make the dopant stay mainly near substrate surface. In some embodiments, the implant is performed at an angle a between about 30° to about 60°. In some other embodiments, the implant is performed at an angle "α" between about 40° to about 50°. During implant, the substrate is rotated to ensure the dopants are uniformly dispersed on the top surface of the dopant region 130 under the sacrificial oxide layer. FIG. 2F shows that N+ source dopant is implanted in regions 127, which are convex-shaped (with the convex surface facing the substrate surface). In some embodiments, the source regions 127 are above surfaces of gate polysilicon 105.

Figure 2G:
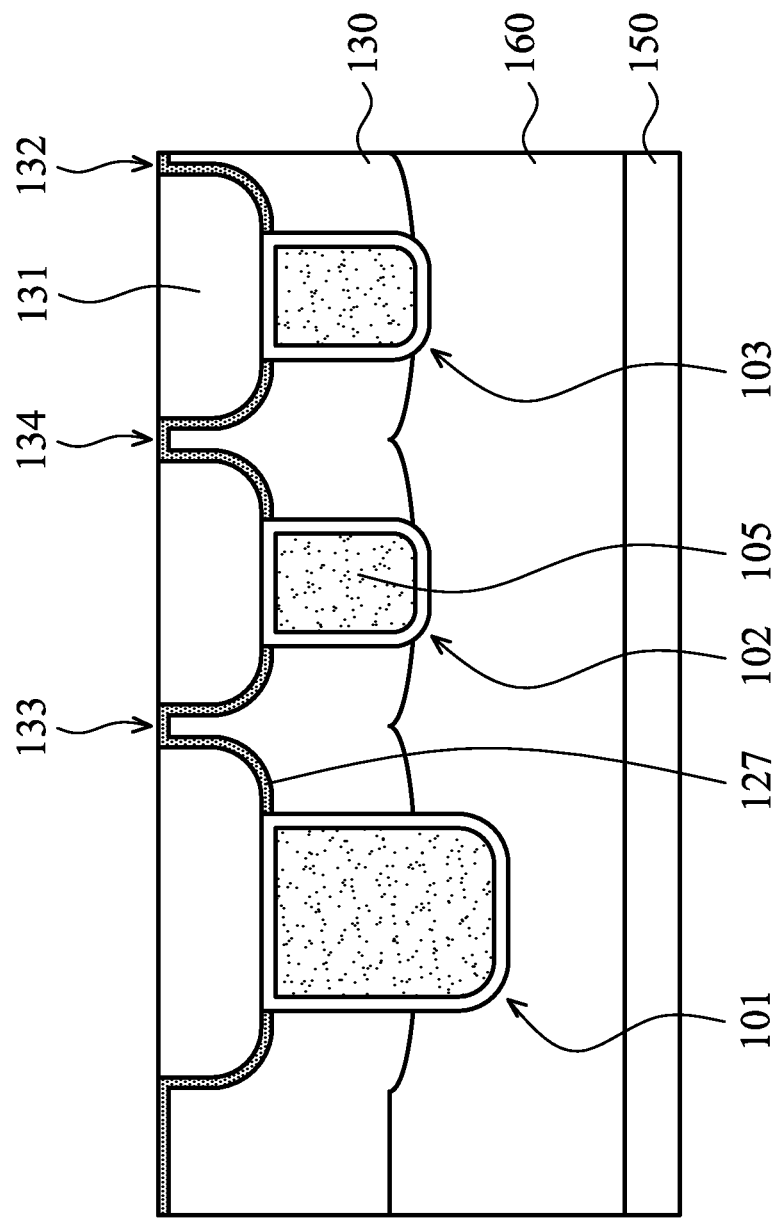
Figure 2H:
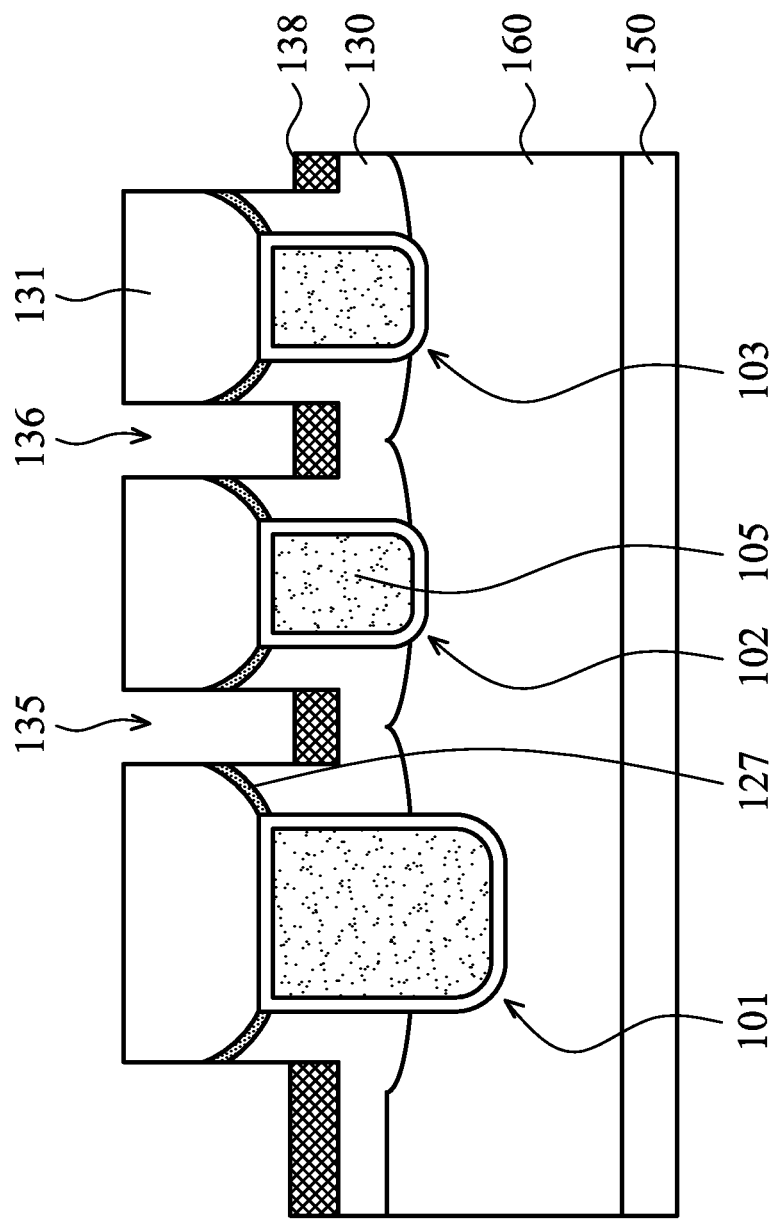

After source implant, a dielectric layer 131 is deposited and planarized to the silicon surface 132, as shown in FIG. 2G, in accordance with some embodiments. The planarized dielectric layer 131 fills the openings at the top of trenches 101, 102, and 103. Afterwards, a blanket silicon dry etching is performed to create self-aligned contact openings 135 and 136, as shown in FIG. 2H in accordance with some embodiments. The silicon region 133 between trenches 101 and 102 and region 134 between trenches 102 and 103 of FIG. 2G are etched to create contact openings 135 and 136 respectively, as shown in FIG. 2H. The contact openings 135 and 136 are created without lithographical patterning; therefore, the contact openings 135 and 136 are self-aligned. Afterwards, a P+ pickup implant is performed. P+ dopants (or high concentration of P dopants) are implanted into exposed silicon regions 138, as shown in FIG. 2H. In some embodiments, the widths of openings 135 and 136 are between about 0.1 μm to about 2.0 μm. The P+ pickup implant makes the source contacts ohmic contacts.

Figure 2I:
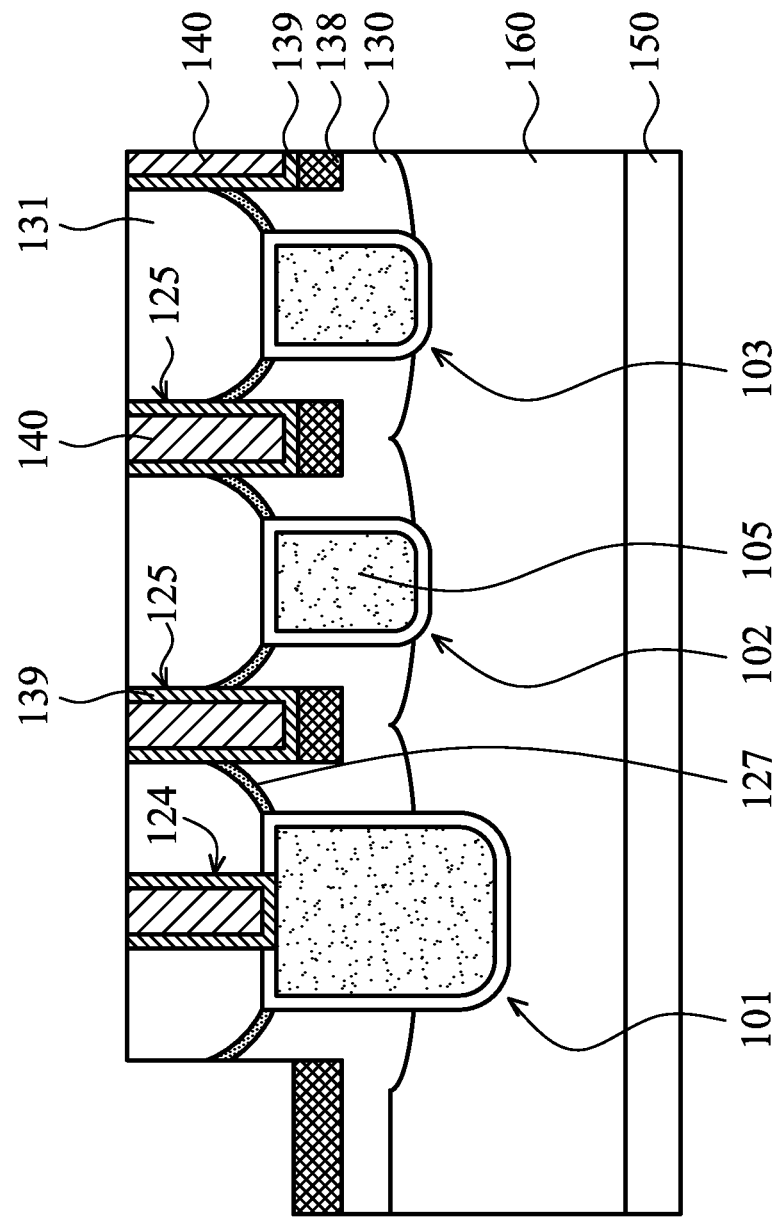

After creating contact openings, a photoresist layer (not shown) is applied on the substrate and patterned to create a gate contact opening (not shown), in accordance with some embodiments. The photoresist is removed afterwards. After the gate contact opening is created, the source contact openings 135 and 136, and gate contact opening are filled by an adhesion layer 139 and a contact metal layer 140. In some embodiments, the adhesion layer 139 is made of Ti/TiN (a dual layer) and the contact metal is made of CVD tungsten. The contact metal and adhesion layer outside the contact openings (or plugs) are removed afterwards, as shown in FIG. 2I in accordance with some embodiments. In some embodments, the adhesion layer 139 and the contact metal layer 140 outside of the contacts are removed by an etchback process or by CMP.

Figure 2J:
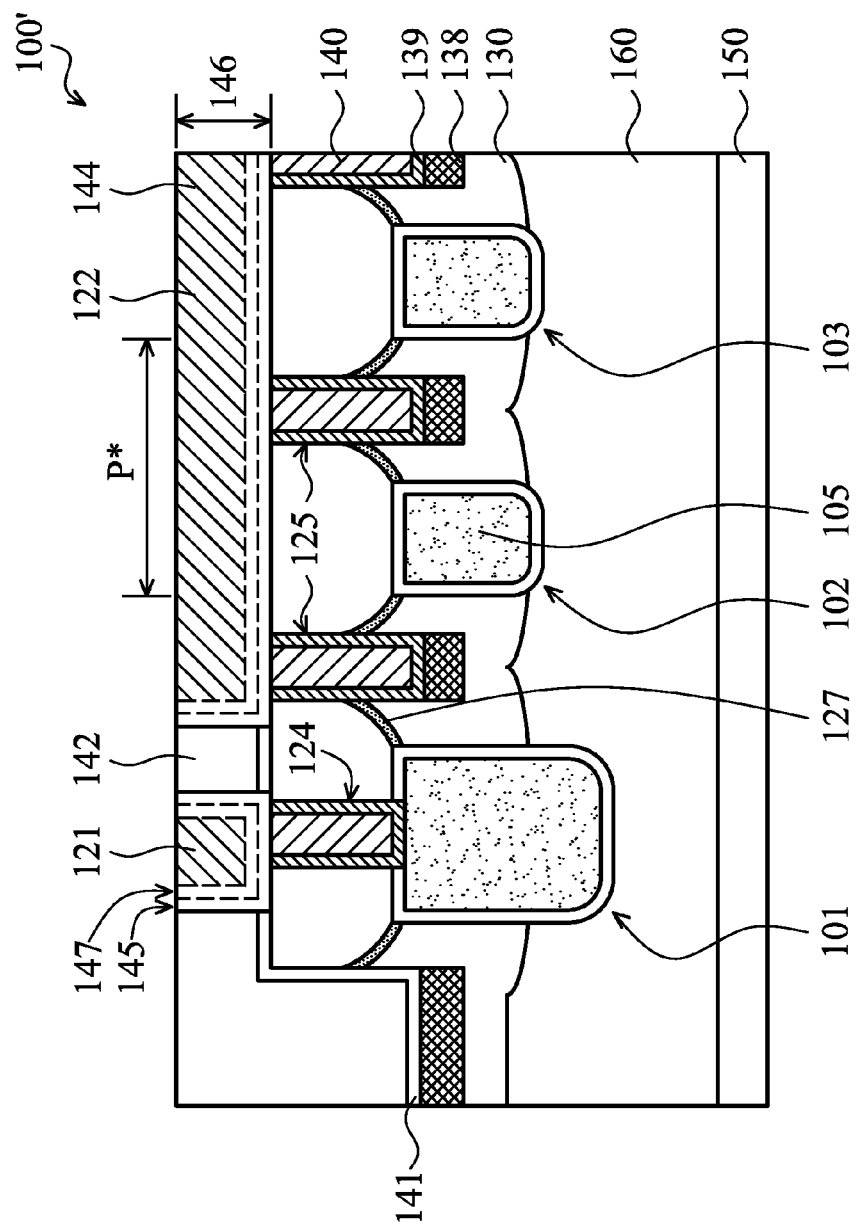

After the contact plugs, 124 and 125, are formed, a dielectric etch stop layer 141 is deposited, as shown in FIG. 2J in accordance with some embodiments. In some embodiments, the dielectric etch stop layer 141 is made of nitride and has a thickness between about 100 Å to about 2000 Å. Afterwards, an inter-level dielectric (ILD) oxide layer 142 is deposited and planarized by CMP to a final thickness 146 above the contacts 124 and 125, also as shown in FIG. 2J. In some embodiments, the ILD oxide layer 142 can be deposited by a CVD process and has a pre-CMP thickness between about 5000 Å to about 25,000 Å. In some embodiments, the final thickness 146 above contacts 124 and 125 is between about 2000 Å to about 10,000 Å. After planarization of ILD oxide layer 142, a photoresist layer (not shown) is used to pattern the ILD oxide layer 142 to form metal trenches for metal deposition. After the metal openings are created, a metal layer 144 is deposited and planarized to leave the metal layer 144 only in the trenches. The metal layer 144 can be made of conductive metal with low resistivity, such as Al, copper, or a copper alloy. The metal layer 144 can be deposited by PVD, CVD, electroless plating, or electrochemical plating (ECP). The metal layer 144 above the gate trench 101 is also labeled as gate metal 121 and the metal layer 144 above the cell trenches 102 and 103 is also labeled as source metal 122.

If copper or copper alloy is used, a copper diffusion barrier layer 145 is needed to block copper diffusion. Examples of materials suitable to be used as the copper diffusion barrier layer 145 include, but are not limited to, Ti, TiN, Ta, TaN, or a combination of above-mentioned materials. If copper is deposited by ECP, a copper seed layer 147 is often needed. In some embodiments, the copper seed layer 146 is deposited by PVD.

Since the source contacts 125 are formed without lithographical patterning and alignment, the cell pitch "P*" can be smaller than the pitch P of FIG. 1. In some embodiments, the cell pitch for trench MOSFET 100' is between about 0.4 µm to about 5 µm.

Figure 3:
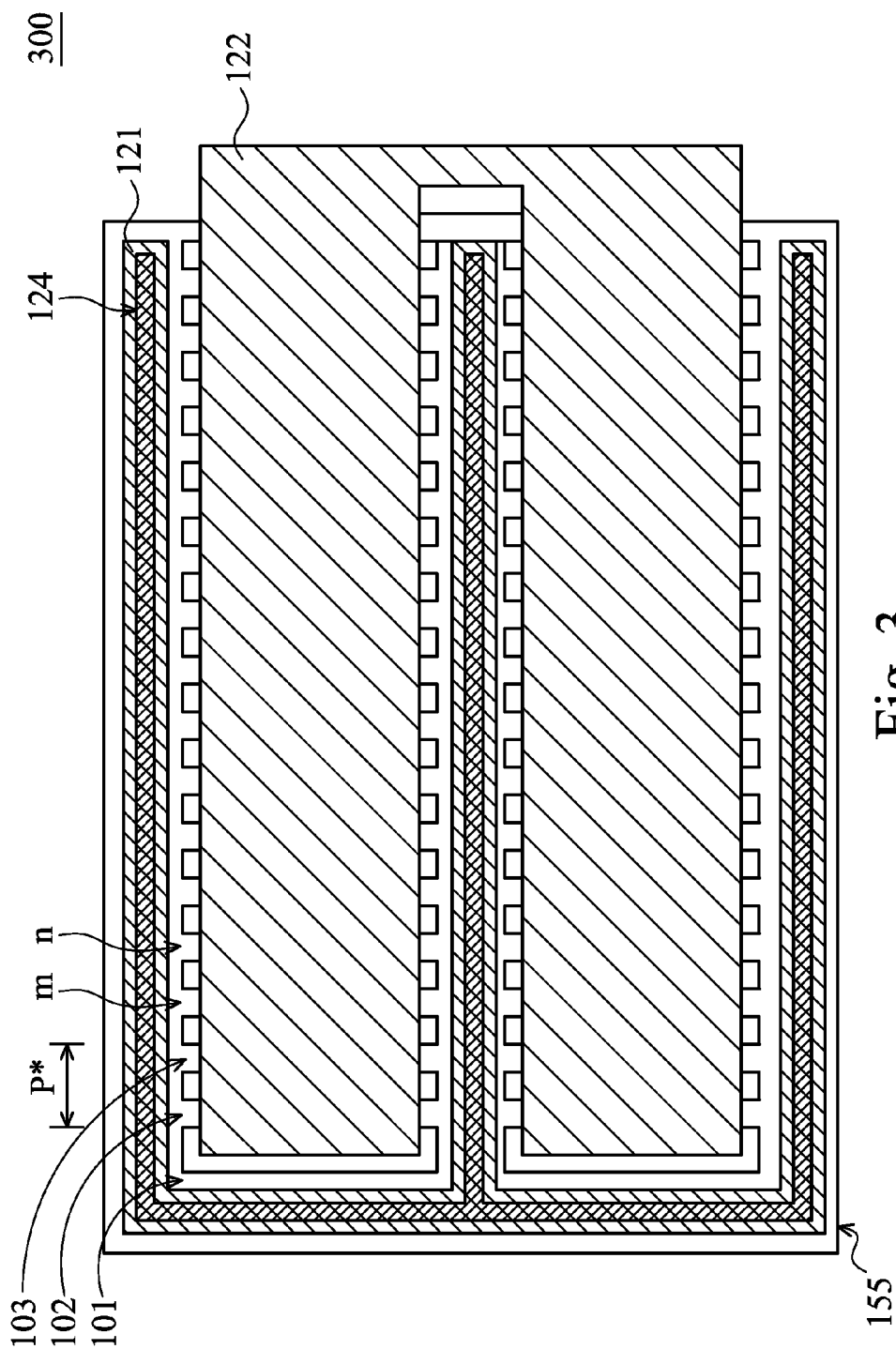
FIG. 3 shows a top view of a power device using a trench MOSFET, in accordance with some embodiments.
Figure 2F:
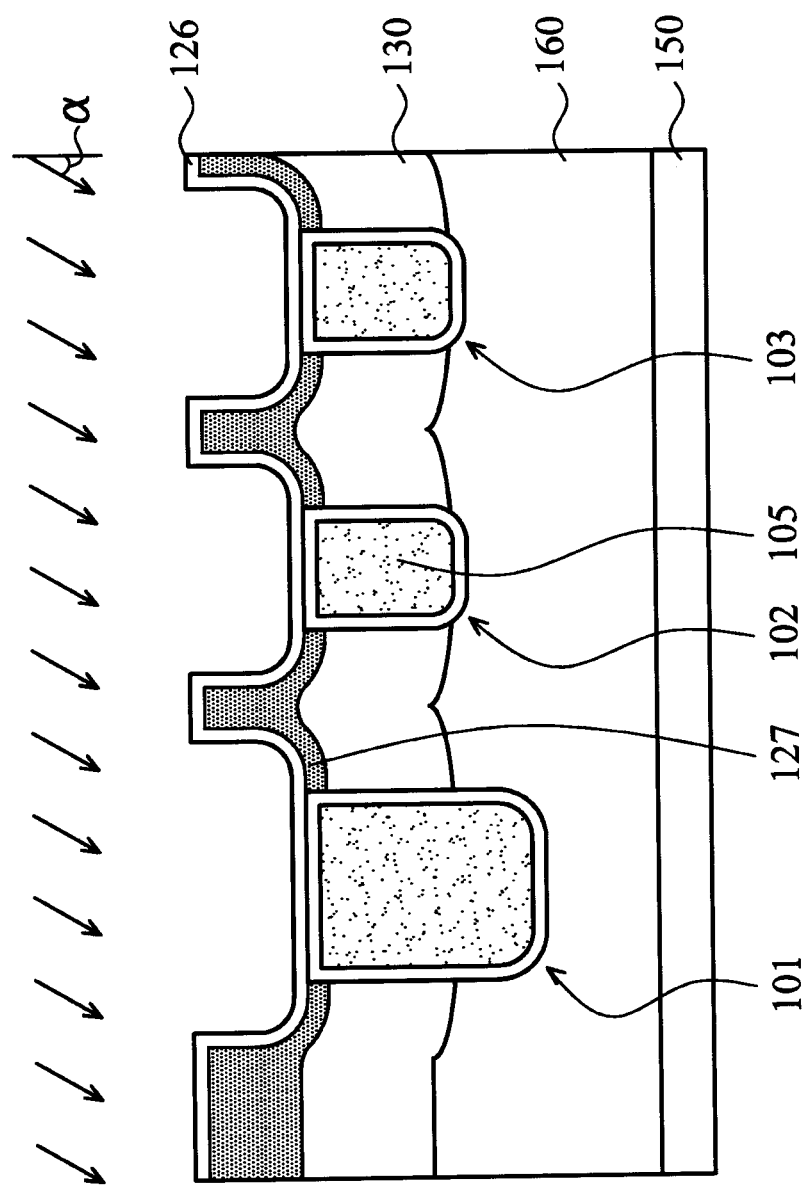
Figure 2G:
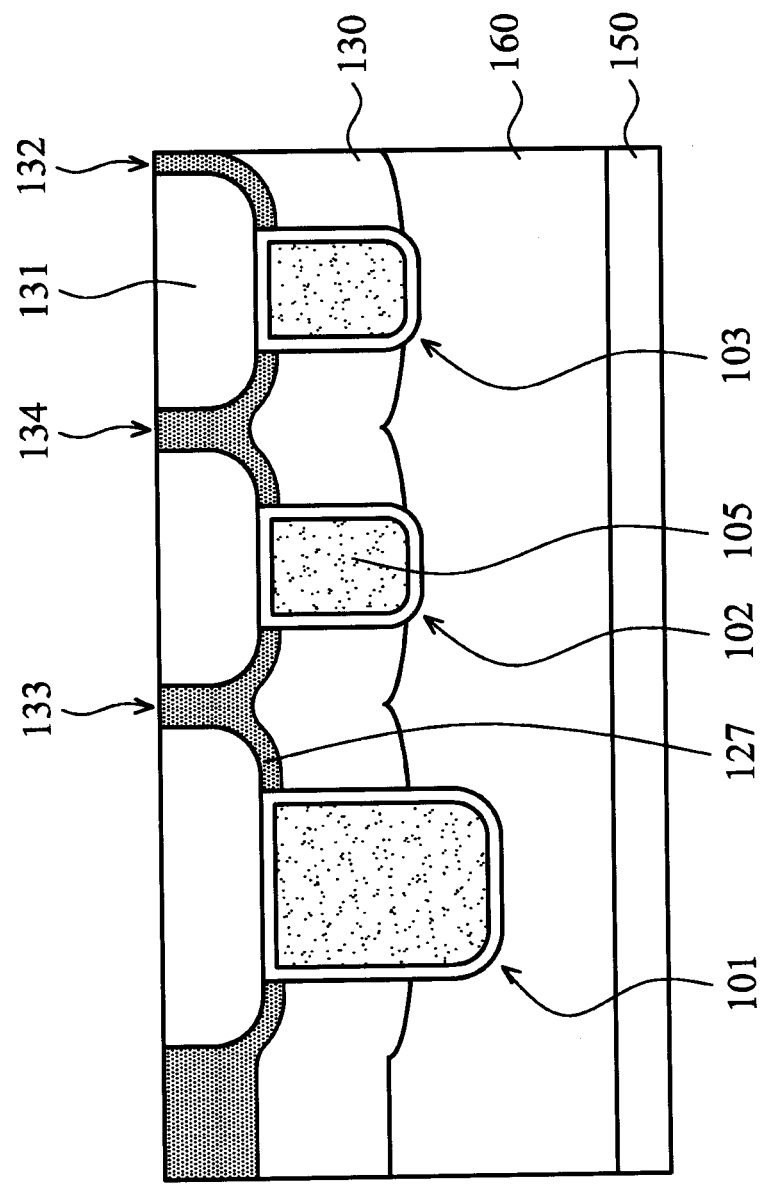

FIG. 3 shows a top view of a power device 300 using a trench MOSFET, in accordance with some embodiments. The trench MOSFET 100 described above is part of power device 300. FIG. 3 shows the gate metal 121 and source metal 122. FIG. 3 also shows cell trenches 102 and 103. Next to trenches 102 and 103, there are a number of cell trenches, such as trenches "m", "n", etc. Surrounding the gate metal is a termination trench 155 that isolate power device 300 from surrounding area. FIG. 3 further shows gate trench 101 and gate contact 124. The source contacts 125 are hidden under source metal 122 and are not shown. FIG. 3 also shows cell pitch "P*. Since there are numerous cell trenches, such as trenches 102, 103, m, n, . . . , etc., cell pitch "P*" needs to be kept small. Using self-aligned contacts as source contacts allow the pitch to be kept small, since the alignment allowance can be eliminated.

The process methods and structures mentioned above for creating a trench MOSFET enables self-aligned contacts to be formed to allow decreasing pitch size for trench MOSFET. The self-aligned contacts are formed by etching exposed silicon areas without using lithographical mask and alignment. As a result, the allowance for alignment can be saved and the pitch size can be decreased.

In one embodiment, a trench metal oxide semiconductor field effect transistor (MOSFET) structure on a substrate is provided. The trench MOS structure includes a first trench and a second trench on the substrate, and both the first trench and the second trench are lined with a gate dielectric layer and filled with gate polysilicon. The trench MOS structure also includes a self-aligned source contact between the first trench and the second trench, and he self-aligned source contact is connected to a source metal. The trench MOS structure further includes a gate contact above the first trench, and the gate contact is connected to a gate metal and to the gate polysilicon in the first trench. In addition, the trench MOS structure includes a source region surrounding the self-aligned source contact, wherein the source region is convex-shaped.

In another embodiment, a trench metal oxide semiconductor field effect transistor (MOSFET) structure on a substrate is provided. The trench MOS structure includes a first trench, a second trench, and a third trench on the substrate. The first trench, the second trench, and the third trench are all lined with a gate dielectric layer and filled with gate polysilicon. The trench MOS structure also includes a first self-aligned source contact between the first trench and the second trench and a second self-aligned source contact between the second trench and the third trench. Both the first and the second self-aligned source contacts are connected to a source metal. The trench MOS structure further includes a gate contact above the first trench, and the gate contact is connected to a gate metal and to the gate polysilicon in the first trench. In addition, the trench MOS structure includes a first source region surrounding the first self-aligned source contact and a second source region surrounding the second self-aligned source contact, and both the first and the second source regions are convex-shaped.

In yet another embodiment, a method of forming a trench MOSFET on a substrate is provided. The method includes etching the substrate to create a plurality of trenches with a hard mask layer, and lining the plurality of trenches with a gate oxide layer. The method also includes filling the plurality of trenches with doped polysilicon, and etching back the doped polysilicon in the plurality of trenches to below top surfaces of the trenches. The method further includes depositing a dielectric layer on the substrate after etching back the doped polysilicon. The dielectric layer has a minimal deposition on the sidewalls of the plurality of trenches. In addition, the method includes performing a wet oxide etch to removed the dielectric layer on the sidewalls on the plurality of trenches to expose silicon on the sidewalls of the plurality of trenches. Additionally, the method includes performing an isotropic silicon etch to undercut silicon under the hard mask layer. Empty regions above the plurality of trenches and regions under the hard mask layer with silicon being undercut with silicon by the isotropic silicon etch form bowl-shaped regions. The method also includes removing the hard mask layer, and performing source dopant implant on the substrate to form convex-shaped source regions on exposed silicon. The convex-shaped source regions have surfaces following surfaces of the bowl-shaped regions. The method further includes filling the bowl-shaped region with a dielectric layer, performing a silicon etch to form self-aligned source contact openings, and filling the contact plugs with contact metal to form self-aligned contacts.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A trench metal oxide semiconductor field effect transistor (MOSFET) structure on a substrate, comprising:
 a first trench and a second trench on the substrate, wherein both the first trench and the second trench are lined with a gate dielectric layer and filled with gate polysilicon;
 a self-aligned source contact between the first trench and the second trench, wherein the self-aligned source contact is connected to a source metal;
 a gate contact above the first trench, wherein the gate contact is connected to a gate metal and to the gate polysilicon in the first trench; and
 a source region surrounding the self-aligned source contact,
 wherein the source region comprises a convex surface and a curved surface directly above the convex surface.

2. The trench MOSFET structure of claim 1, wherein the trench MOSFET is an N-MOSFET or a P-MOSFET.

3. The trench MOSFET structure of claim 1, wherein the trench MOSFET is part of a power device, which operates between about 1.8V to about 600V.

4. The trench MOSFET structure of claim 1, wherein a pitch of the trench MOSFET is between about 0.5 μm to about 5 μm.

5. The trench MOSFET structure of claim 1, wherein a doped substrate region below the first and the second trenches is a drain region of the trench MOSFET.

6. The trench MOSFET structure of claim 5, wherein the trench MOSFET is N-type and the source region and the drain region are doped with N-type dopants.

7. The trench MOSFET structure of claim 1, wherein there is a third trench next to the second trench, and wherein the second trench is between the first and the third trenches, and wherein a distance between the first and the second trenches is between about 0.5 μm to about 5 μm.

8. The trench MOSFET structure of claim 1, wherein a silicon region directly below the self-aligned source contact has a higher dopant concentration than a surrounding region.

9. The trench MOSFET structure of claim 1, wherein the gate dielectric layer has a thickness between about 40 Å to about 2000 Å.

10. The trench MOSFET structure of claim 1, wherein the source region is above a surface of gate polysilicon in the second trench.

11. A trench metal oxide semiconductor field effect transistor (MOSFET) structure on a substrate, comprising:
 a first trench, a second trench, and a third trench on the substrate, wherein the first trench, the second trench, and the third trench are lined with a gate dielectric layer and filled with gate polysilicon;
 a first self-aligned source contact between the first trench and the second trench and a second self-aligned source contact between the second trench and the third trench, wherein both the first and the second self-aligned source contacts are connected to a source metal;
 a gate contact above the first trench, wherein the gate contact is connected to a gate metal and to the gate polysilicon in the first trench; and
 a first source region surrounding the first self-aligned source contact and a second source region surrounding the second self-aligned source contact, wherein both the first and the second source regions are convex-shaped, and wherein the first source region and the second source region are above an upper surface of the gate polysilicon in the second trench.

12. The trench MOSFET structure of claim 11, wherein a doped substrate region below the first, the second, and the third trenches is a drain region of the trench MOSFET.

13. The trench MOSFET structure of claim 11, wherein silicon regions directly below the first and the second self-aligned source contacts have higher dopant concentrations than surrounding regions.

14. A transistor comprising:
 a substrate doped with a first type dopant;
 an epitaxial layer over the substrate, the epitaxial layer having a doped portion doped with a second type dopant and a source region doped with the first type dopant;
 a first gate structure in the epitaxial layer, at least a portion of the first gate structure being adjacent to the doped portion, the first gate structure comprising:
  a gate electrode; and
  a gate dielectric layer sandwiched between the gate electrode and the epitaxial layer;
 a second gate structure in the epitaxial layer, at least a portion of the second gate structure being adjacent to the doped portion, the second gate structure comprising:
  a gate electrode; and
  a gate dielectric layer sandwiched between the gate electrode and the epitaxial layer;
 a source contact between the first gate structure and the second gate structure, the source region being adjacent to the source contact and convex-shaped with a convex surface facing the substrate; and
 a gate contact electrically coupled to the gate electrode of the first gate structure and the gate electrode of the second gate structure,
 wherein the source region is above an upper surface of the second gate structure.

15. The transistor of claim 14, wherein a pitch between the first gate structure and the second gate structure ranges from about 0.5 μm to about 5 μm.

16. The transistor of claim 14, wherein the substrate is usable as a drain terminal of the transistor.

17. The transistor of claim 14, further comprising:
 a third gate structure in the epitaxial layer, at least a portion of the third gate structure being adjacent to the doped portion, the third gate structure comprising:
  a gate electrode; and
  a gate dielectric layer sandwiched between the gate electrode and the epitaxial layer; and
 another source contact between the second gate structure and the third gate structure.

18. The transistor of claim 17, wherein a pitch between the second gate structure and the third gate structure ranges from about 0.5 μm to about 5 μm.

19. The transistor of claim 14, wherein the gate dielectric layer of the second gate structure has a thickness ranging from about 40 Å to about 2000 Å.

20. The transistor of claim 14, wherein the source region further comprises a curved surface directly above the convex surface.

* * * * *

UNITED STATES PATENT AND TRADEMARK OFFICE
CERTIFICATE OF CORRECTION

| | | |
|---|---|---|
| PATENT NO. | : 8,497,551 B2 | Page 1 of 3 |
| APPLICATION NO. | : 12/792025 | |
| DATED | : July 30, 2013 | |
| INVENTOR(S) | : Alex Kalnitsky et al. | |

It is certified that error appears in the above-identified patent and that said Letters Patent is hereby corrected as shown below:

In the Drawings

Delete Figure 2F and 2G and replace with attached replacement Figures 2F and 2G.

Signed and Sealed this
Nineteenth Day of November, 2013

Teresa Stanek Rea
*Deputy Director of the United States Patent and Trademark Office*